(12) United States Patent
Naitoh et al.

(10) Patent No.: US 7,290,580 B2
(45) Date of Patent: Nov. 6, 2007

(54) REINFORCEMENT COMBINING APPARATUS AND METHOD OF COMBINING REINFORCEMENT

(75) Inventors: Katsuyuki Naitoh, Tenri (JP); Kazuhiko Fukuta, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 247 days.

(21) Appl. No.: 10/793,873

(22) Filed: Mar. 8, 2004

(65) Prior Publication Data
US 2004/0177774 A1   Sep. 16, 2004

(30) Foreign Application Priority Data
Mar. 12, 2003 (JP) .............................. 2003-067101

(51) Int. Cl.
*B32B 37/00* (2006.01)
(52) U.S. Cl. .................... 156/581; 156/285; 156/583.1; 156/583.3
(58) Field of Classification Search ................. 156/382, 156/580, 581, 583.1, 583.3, 285, 286
See application file for complete search history.

(56) References Cited

U.S. PATENT DOCUMENTS 6,951,593 B2 * 10/2005 Yamaguchi .................. 156/230

2001/0015264 A1 * 8/2001 Stein et al. .................. 156/581

FOREIGN PATENT DOCUMENTS

| JP | 09-293793 | 12/1991 |
| JP | 05-109827 | 4/1993 |
| JP | 07-170031 | 7/1995 |
| JP | 07-170032 | 7/1995 |
| JP | 2000-098413 | 4/2000 |

* cited by examiner

*Primary Examiner*—James Sells
(74) *Attorney, Agent, or Firm*—Nixon & Vanderhye P.C.

(57) ABSTRACT

The reinforcement combining apparatus includes: a stage having a pressing surface; and a tool having a pressing surface opposite to the pressing surface of the stage, wherein the stage and the tool sandwich and press a flexible wiring substrate and a reinforcement, thereby combining the reinforcement with the flexible wiring substrate. A heat conduction rubber having elasticity which allows the heat conduction rubber to transform at an arbitrary area is provided as a part of the pressing surface of the tool, and the tool exerts pressure to the flexible wiring substrate via the heat conduction rubber. Thus, it is possible to bond the reinforcement to the flexible wiring with them uniformly appressed to each other.

23 Claims, 5 Drawing Sheets

REINFORCEMENT COMBINING APPARATUS AND METHOD OF COMBINING REINFORCEMENT

This Nonprovisional application claims priority under 35 U.S.C. § 119(a) on patent application Ser. No. 2003/67101 filed in Japan on Mar. 12, 2003, the entire contents of which are hereby incorporated by reference.

1. FIELD OF THE INVENTION

The present invention relates to a reinforcement combining apparatus and a method of combining a reinforcement, by which a reinforcement is combined with flexible wiring substrate, used as a package substrate of a TCP (Tape Carrier Package), a COF (Chip on Film), and the like, so as to partially keep a mechanical strength.

2. BACKGROUND OF THE INVENTION

A liquid crystal panel has been required to be thinner, lighter, more durable, and to consume less power. The liquid crystal panel having these characteristics are utilized not only in mobile devices such as a cellular phone but also in display sections of a personal computer, a home television, and the like. With popularization of the liquid crystal panel, various techniques in packaging have been developed and applied. For example, as a packaging technique of a liquid crystal driver IC which has been developed recently, there has been used a packaging technique utilizing a flexible wiring substrate of a TCP, a COF, and the like, thereby realizing high-density package and a thinner and lighter liquid crystal panel.

The flexible wiring substrate is constituted of (i) a tape base material made of polyimide or the like and (ii) a conductive wiring formed thereon. The conductive wiring is formed by photo-etching with Cu or the like. It is often that installation parts and the like are soldered on an outermost surface of the conductive wiring. Further, when Cu is used to form the conductive wiring, it is often that the surface of the conductive wiring is coated by Sn, Au, and the like. Further, on the flexible wiring substrate's surface having the conductive wiring, a solder resist is formed on an area other than portions connected to external circuits so as to protect the conductive wiring.

Meanwhile, it is general that the flexible substrate is formed in a long tape manner in manufacturing steps of the TCP and COF in which semiconductor chips are installed. Thus, it is possible to sequentially transport the flexible wiring substrate to production apparatuses used in the respective manufacturing steps, so that it is possible to efficiently form a module on an assembly line. Further, the flexible wiring substrate is formed in a tape manner, so that it is possible to supply and collect the flexible wiring substrate by rolling it up with a reel. Thus, the flexible wiring substrate formed in a long tape manner is advantageous in mass-production of semiconductor devices.

As described above, as to the flexible wiring substrate, a module is formed by installing semiconductor chips and other parts. In this case, connectors may be formed on the flexible wiring substrate as connection terminals, which allow connection with external circuits, for the sake of convenience in assembling and replacing installation parts. Thus, in the periphery of the connectors of the flexible wiring substrate, reinforcement is required so that the flexible wiring substrate is not damaged by a mechanical load exerted in connecting the external circuits to the connectors. Accordingly, it is necessary to enhance the strength of the flexible wiring substrate by combining a reinforcement with a surface positioned on a back side of a connector-installation area of the flexible wiring substrate.

The following description explains examples of a conventional reinforcement combining apparatus and a method of combining the reinforcement with the flexible wiring substrate with reference to FIG. 7 to FIG. 9.

FIG. 7 is a cross sectional view schematically showing an important portion of a reinforcement combining apparatus for combining a reinforcement with the flexible wiring substrate. As shown in FIG. 7, a pressing surface 102 of a stage (lower holding member) 101 and a pressing surface 104 of a tool (upper holding member) 103 are positioned opposite to each other in parallel. Between them, a flexible wiring substrate 105 formed in a long tape manner is disposed so that its surface having conductive wiring (not shown) faces upward. The flexible wiring substrate 105 is disposed at the foregoing position by means of a sprocket and a transport reel (that are not shown). Then, a reinforcement 106 is disposed on the pressing surface 102 of the stage 101.

The reinforcement 106 is made of polyimide, PET, and the like, and adhesive 107 used to bond the reinforcement 106 to the flexible wiring substrate 105 is applied to a bonded surface of the flexible wiring substrate 105 in advance.

FIG. 8 shows a condition under which the reinforcement 106 is combined with the flexible wiring substrate 105 by using the reinforcement combining apparatus of FIG. 7. As shown in FIG. 8, a position of the reinforcement 106 disposed on the stage 101 and a position of the flexible wiring substrate 105 are adjusted, and the stage 101 is raised, and the tool 103 is made to descend. The stage 101 and the tool 103 press the flexible wiring substrate 105 and the reinforcement 106 so that they are combined with each other.

Here, the adhesive for bonding the flexible wiring substrate to the reinforcement is described. As the adhesive, it is possible to use a normal temperature type having an adhesive force at normal temperature and a thermosetting type having an adhesive force when heated. In case of using the normal temperature type, when a bonding condition is set so that: bonding temperature is normal temperature, and a bonding time is 0.5 seconds, and a bonding pressure is 0.5 Kg/cm$^2$, it is possible to preferably bond the flexible wiring substrate and the reinforcement to each other.

However, in case of bonding the normal temperature type adhesive, when a heating process such as solder reflow is performed after bonding the reinforcement, the adhesive which comes out due to the heating is sometime transcribed to an unnecessary portion or spattered, so that this deteriorates the quality of the semiconductor device. Further, the normal temperature type adhesive has an adhesive force after the bonding, so that this raises such problem that: when an external shape of the flexible wiring substrate is punched out, the adhesive adheres to a punching die.

Meanwhile, in case of adopting the thermosetting type as the adhesive, when a bonding condition is set so that: bonding temperature (of both the tool 101 and the stage 103) is 200° C., and a bonding time is 3 seconds, and a bonding pressure is 28 Kg/cm$^2$, it is possible to preferably bond the flexible wiring substrate and the reinforcement to each other. In steps performed thereafter, the adhesive completely sets, so that it is possible to avoid the foregoing troubles brought about by using the normal temperature adhesive.

In this manner, the thermosetting type adhesive is used as the foregoing adhesive, so that troubles caused by the adhesive can be solved. However, the following problems are brought about in pressing the flexible wiring substrate and the reinforcement so that they are combined with each other.

FIG. 9 shows an enlarged view of a connection portion between the flexible wiring substrate and the reinforcement that are pressed by the reinforcement combining apparatus shown in FIG. 8. As shown in FIG. 9, a solder resist 1011 is an outermost layer of the flexible wiring substrate, so that mainly the solder resist is in contact with the pressing surface 104 of the tool 103 with it pressed by the pressing surface 104. Thus, the adhesive 107 corresponding to an area having the solder resist 1011 receives pressure, but the adhesive 107 corresponding to an area having no solder resist 1011 receives less pressure.

Here, the adhesive 107 has an adhesive force. Thus, even when the adhesive 107 does not completely receive the pressure, it is possible to bond the reinforcement 106 and the flexible wiring substrate 105 to each other. However, air bubbles may occur in (i) an interface between the adhesive 107 and the reinforcement 106 or the flexible wiring substrate or (ii) the adhesive 107, so that the air bubbles may deteriorate the bonding property. That is, in order to remove the air bubbles, it is necessary to press the adhesive 107 to some extend.

Thus, when the adhesive 107 has a portion which receives less pressure, there occurs a portion which is not sufficiently bonded, so that this raises such problem that the reinforcement 106 exfoliates from the flexible wiring substrate 105.

Further, in the flexible wiring substrate to which the reinforcement has been bonded, in case of installing the connectors positioned on the backside of the surface bonded to the reinforcement, the connectors are subjected to reflow process by using solder and the like, thereby installing the connectors. Here, in case where the air bubbles occur in the adhesive 107, when the flexible wiring substrate is put into a reflow oven, the air bubbles swell due to the drastic rise of temperature, so that this deteriorates the bonding property.

Further, when the air bubbles swell in the adhesive 107, this brings bout not only the deterioration of the bonding property but also the following problem. For example, in a flexible wiring substrate used as a driver of a liquid crystal display, a large number of terminals for receiving a signal such as a voltage, timing, data, bias for operating a semiconductor device, are installed. Thus, it is required to provide a larger number of connector pins on the flexible wiring substrate so as to cover the large number of terminals. Accordingly, it is necessary to make a pitch of the pins for surface mounting finer. Further, it is required to set the flatness in a connection surface of each connector to be within an error range of approximately dozens μm so as to realize preferable connection. However, when the air bubbles occur in the adhesive 107, the flatness of the connector is deteriorated, so that the connection property between the connectors and the external circuits is deteriorated. As a result, so-called connection failure occurs.

Meanwhile, as a method of combining the reinforcement with the flexible wiring substrate, Japanese Unexamined Patent Publication No. 170031/1995 (Tokukaihei 7-170031) (Publication date: Jul. 4, 1995) proposes a method in which: (i) a reinforcement having holes for positioning, (ii) a flexible wiring substrate having holes for positioning, and (iii) a buffer material having escape holes are sequentially put into a positioning pin which is provided on a drag, and these members are pressed by a top force, thereby combining them with each other. However, this method requires a combining operation for each process, so that it is impossible to freely provide a combination of the flexible wiring substrate and the reinforcement. Thus, the foregoing method does not cover sequential processes for combining the reinforcement with the flexible wiring substrate in manufacturing a TCP and a COF by means of a general reel-to-reel process which allows the reinforcement and the flexible wiring substrate to be freely combined. Thus, the method is not suitable for mass-production.

SUMMARY OF THE INVENTION

The present invention was devised in view of the foregoing problems, and its object is to provide a reinforcement combining apparatus and a method of combining a reinforcement, whereby (i) it is possible to uniformly bond the reinforcement to a flexible wiring substrate with them appressed to each other in bonding the reinforcement to the flexible wiring substrate, and (ii) it is possible to bond the reinforcement to the flexible wiring substrate with high durability and reliability without bringing about air bubbles therein in bonding the reinforcement to the flexible wiring substrate.

In order to solve the foregoing problems, the reinforcement combining apparatus according to the present invention, which combines a reinforcement with a flexible wiring substrate obtained by forming a film substrate on a conductive wiring, includes: a first pressing member having a pressing surface; and a second pressing member having a pressing surface opposite to the pressing surface of the first pressing member, wherein the first pressing member and the second pressing member sandwich and press the flexible wiring substrate and the reinforcement, so that pressure causes the reinforcement to be combined with the flexible wiring substrate, and at least one of the pressing surfaces of the first pressing member and the second pressing member has elasticity which allows the pressing surface of the first pressing member or the pressing surface of the second pressing member to transform at an arbitrary area.

According to the foregoing arrangement, the flexible wiring substrate and the reinforcement are disposed between the pressing surface of the first pressing member and the pressing surface of the second pressing member, and pressure is exerted from the first and second pressing members to the flexible wiring substrate and the reinforcement, so that the flexible wiring substrate and the reinforcement are bonded to each other with them appressed to each other.

Here, since the flexible wiring substrate is arranged so that the conductive wiring is formed on the film substrate, a thickness of a portion having the conductive wiring is different from a thickness of a portion having no conductive wiring for example. In this case, when the flexible wiring substrate is pressed by the first and second pressing members as described above, the pressure is exerted only to a portion having a larger thickness in the flexible wiring substrate, so that appropriate pressure is not exerted to a thicker portion. Thus, some portions are incompletely bonded, so that the flexible wiring substrate and the reinforcement are incompletely combined with each other.

According to the foregoing arrangement, at least one of the pressing surfaces of the first and second pressing members has elasticity which allows the pressing surface of the first pressing member or the pressing surface of the second pressing member to transform at an arbitrary area, so that it is possible to appropriately give the pressure also to a thinner portion of the flexible wiring substrate by allowing the pressing surface to be sufficiently compressed at a position where the flexible wiring substrate is thicker. That is, it is possible to appropriately give the pressure to entire surfaces of the flexible wiring substrate and the reinforcement, so that it is possible to make the entire surfaces of the flexible wiring substrate and the reinforcement appressed to each other.

Thus, in using adhesive so as to bond the reinforcement to the flexible wiring substrate, it is possible to extrude air bubbles brought about in an interface between the reinforcement and the flexible wiring substrate or in the adhesive by the pressure, so that it is possible to stabilize a bonding property, and it is possible to prevent surface flatness of the flexible wiring substrate from being deteriorated by expansion of air bubbles. That is, according to the foregoing arrangement, it is possible to perform the combining process with high durability and quality.

In order to solve the foregoing problems, the method of the present invention for combining a reinforcement to a flexible wiring substrate obtained by forming a conductive wiring on a film substrate includes the steps of: (i) disposing the reinforcement and the flexible wiring substrate so that bonded surfaces of the reinforcement and the flexible wiring substrate are opposite to each other; and (ii) pressing the reinforcement and the flexible wiring substrate, that have been disposed in the step (i), from a side of the reinforcement and a side of the flexible wiring substrate, wherein in the step (ii), a member having elasticity which allows the member to transform at an arbitrary area is caused to exert pressure to at least one of the reinforcement and the flexible wiring substrate.

According to the foregoing method, a member having elasticity which allows the member to transform at an arbitrary area is caused to exert pressure to at least one of the reinforcement and the flexible wiring substrate, so that it is possible to appropriately give the pressure also to a thinner portion of the flexible wiring substrate by allowing the pressing surface to be sufficiently compressed at a position where the flexible wiring substrate is thicker. That is, it is possible to appropriately give the pressure to entire surfaces of the flexible wiring substrate and the reinforcement, so that it is possible to make the entire surfaces of the flexible wiring substrate and the reinforcement appressed to each other.

Thus, in using adhesive so as to bond the reinforcement to the flexible wiring substrate, it is possible to extrude air bubbles brought about in an interface between the reinforcement and the flexible wiring substrate or in the adhesive by the pressure, so that it is possible to stabilize a bonding property, and it is possible to prevent surface flatness of the flexible wiring substrate from being deteriorated by expansion of air bubbles. That is, according to the foregoing method, it is possible to perform the bonding process with high durability and quality.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 2:
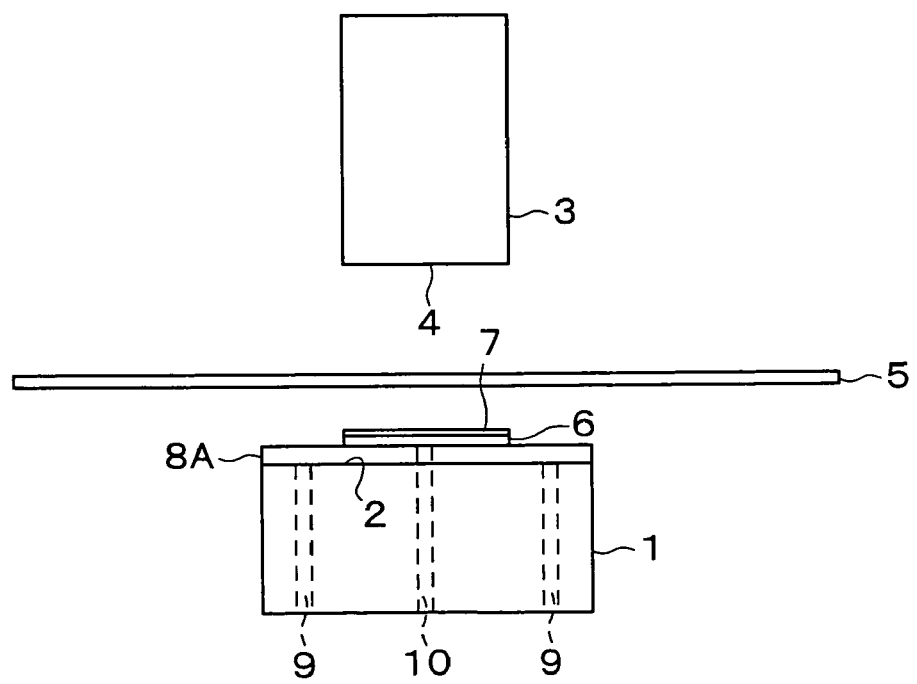
FIG. 2 is a cross sectional view schematically showing another example of the reinforcement combining apparatus according to the present invention.

The following description will explain one embodiment concerning a reinforcement combining apparatus of the present invention with reference to FIG. 2. Note that, the present invention is not limited to this.

FIG. 2 is a cross sectional view schematically showing a reinforcement combining apparatus of the present embodiment, and shows a condition under which a reinforcement has not been combined with a flexible wiring substrate.

(Arrangement of Reinforcement Combining Apparatus)

First, an arrangement of the reinforcement combining apparatus is described. As shown in FIG. 2, the reinforcement combining apparatus includes a stage 1 as a first pressing member for pressing upward and a tool 3 as a second pressing member for pressing downward. An upper surface of the stage 1, i.e., a pressing surface 2 and a lower surface of the tool 3, i.e., a pressing surface 4 are disposed in parallel to each other, and both the surfaces 2 and 4 are opposite to each other. A heat conduction rubber 8A is provided as a buffer member (first buffer member) of the pressing surface 2 of the stage 1 so as to be in parallel to the pressing surface 4 of the tool 3.

The stage 1 and the tool 3 press the flexible wiring substrate 5 and the reinforcement 6 so that they are combined with each other. The reinforcement 6 and the flexible wiring substrate 5 are disposed between the stage 1 and the tool 3 so as to be in parallel to the pressing surfaces 2 and 4, and then are combined with each other. In the present embodiment, the stage 1 is raised and the tool 3 is made to descend so as to press the flexible wiring substrate 5 and the reinforcement 6. However, it may be so arranged that the stage 1 is fixed and the tool 3 is made to descend so as to press the flexible wiring substrate 5 and the reinforcement 6, or it may be so arranged that the tool 3 is fixed and the stage 1 is raised so as to press the flexible wiring substrate 5 and the reinforcement 6.

Further, each of the tool 3 and the stage 1 has a heater (not shown) as heating means therein, thereby heating the flexible wiring substrate 5 and the reinforcement 6. This is because it is necessary to cause the thermosetting adhesive to set by heating in case of using the thermosetting adhesive as the adhesive 7 described later. The heater is controlled, thereby adjusting surface temperature of the stage 1 and the tool 3 to temperature at which the thermosetting adhesive sets. Thus, the stage 1 and the tool 3 each of which presses and heats are constituted of material, such as iron, which is hardly transformed by pressure and heat.

In the pressing surface 2 of the stage 1, there is provided the heat conduction rubber 8A, having a buffer property, as a buffer member so as to cause the flexible wiring substrate 5 and the reinforcement 6 to adhere to each other. Here, the buffer property means an elastic property which allows the heat conduction rubber 8A to transform at an arbitrary area.

The buffer member is not particularly limited as long as it can receive pressure exerted by the stage 1 and the tool 3 and has elasticity, but it is preferable to use rubber and the like. In the present embodiment, the thermosetting adhesive is used to bond the reinforcement 6 to the flexible wiring substrate 5, so that the heat conduction rubber 8A is used. As the heat conduction rubber 8A used in the present embodiment, heat conduction silicon rubber TC-A (commercial name), made by Shin-Etsu Chemical Co., Ltd., whose thickness is 450 µm.

A first vacuum hole 9 is used to fix the heat conduction rubber 8A to the stage 1. The first vacuum hole 9 is provided so as to extend from the pressing surface 2 through the stage 1 to a compressor or the like (not shown). The compressor or the like absorbs the air of the first vacuum hole 9, so that a vacuum is substantially formed inside the first vacuum hole 9. Thus, the heat conduction rubber 8A on the stage 1 is subjected to vacuum absorption so as to be fixed on the stage 1.

The first vacuum hole 9 is provided in the stage 1, so that it is preferable to minimize a hole diameter. This arrangement is made in order that the pressing surface 2 of the stage 1 has a larger area contacting the heat conduction rubber 8A so as to evenly exert pressure to the reinforcement. Further, it is preferable to set the hole diameter of the first vacuum hole 9 so that the heat conduction rubber 8A can be surely fixed on the stage 1 by the vacuum absorption. This arrangement is made in order to avoid such condition that: the heat conduction rubber 8A adheres to the reinforcement 6 after giving pressure, so that the heat conduction rubber 8A is separated from the stage 1. Taking such possibility into consideration, it is preferable to set the hole diameter of the first vacuum hole 9 to approximately 1 mm.

A second vacuum hole 10 is reinforcement fixing means provided so as to dispose the reinforcement 6 on the stage 1 by vacuum absorption. The second vacuum hole 10 is provided so as to extend through the stage 1 and the heat conduction rubber 8A, and is connected to the compressor or the like as in the first vacuum hole 9. As in the first vacuum hole 9, it is preferable to minimize a hole diameter of the second vacuum hole 10 with it capable of keeping the reinforcement 6 fixed to the heat conduction rubber 8A. Specifically, it is preferable to set the hole diameter of the second vacuum hole 10 to approximately 1 mm.

(Arrangement of Flexible Wiring Substrate)

Next, an arrangement of the flexible wiring substrate is described. The flexible wiring substrate 5 includes (i) a conductive wiring formed on the tape base material (the film base material) by photo-etching etc. and (ii) a solder resist etc. for coating a pattern of the conductive wirings.

As the tape base material, any material can be used as long as the conductive wiring can be formed on a surface thereof. Specifically, as the tape base material, an insulating film of polyimide, polyester, or the like is preferably used. A thickness of the tape base material is not particularly limited, but it is preferable to use a thin material so as to realize high flexibility. In the present embodiment, a polyimide film whose thickness is 40 µm is used as the tape base material.

The conductive wiring is not particularly limited as long as it has a conductive property, but Cu or the like is preferably used, and the wiring pattern is formed by photo-etching or the like. It may be so arranged that a surface of the conductive wiring is coated with Sn, Au, or the like. In the present embodiment, as the conductive wiring, a member obtained by forming a pattern on a copper foil film whose thickness is 12 µm by means of photo-etching is used.

Further, in the flexible wiring substrate's surface having the conductive wiring, a solder resist is formed on an area other than portions connected to external circuits in order to protect the conductive wiring. In the present embodiment, as the solder resist, polyimide whose thickness is 50 µm is used.

Further, the flexible wiring substrate 5 is formed in a long tape manner. That is, a plurality of conductive wiring patterns are formed on the tape base material formed in a long tape manner, and when formation of modules is completed, the tape base material is cut for each module. Thus, it is possible to sequentially manufacture the flexible wiring substrate 5 in a reel-to-reel manner with high efficiency. Therefore, the use of the flexible wiring substrate 5 formed in a long tape manner is advantageous in the process for combining a large amount of reinforcements.

Note that, transport holes (not shown) are formed on both sides of the tape base material so as to be positioned at predetermined intervals, and transport sprockets are made to engage with the transport holes, so that the flexible wiring substrate 5 is moved in a longitudinal direction thereof.

(Arrangement of Reinforcement)

Next, an arrangement of the reinforcement 6 is described. The reinforcement 6 reinforces the flexible wiring substrate 5. In the flexible wiring substrate 5, the modules are formed by installing semiconductor chips and other parts. In this case, for the sake of convenience in assembling and replacing installation parts, connectors may be formed as connection terminals for allowing connection with external circuits, on the flexible wiring substrate 5. Thus, in peripheral portions of the connectors of the flexible wiring substrate, it is necessary to make reinforcement which receives a mechanical load brought about in connecting the external circuits to the connectors. In order to avoid any trouble in this arrangement, it is necessary to combine the reinforcement with a back side of the connector-installation area of the flexible wiring substrate so as to enhance the strength of the flexible wiring substrate.

As described above, the reinforcement 6 is required to have the strength to some extent, but it is preferable that the reinforcement 6 has such flexibility that the reinforcement 6 does not exfoliate from the flexible wiring substrate 5 when the flexible wiring substrate 5 is bended. Examples of material having such properties include polyimide, PET, and the like.

A thickness and a size of the reinforcement 6 may be set as desired so as to correspond to an area which requires reinforcement in the flexible wiring substrate 5. In the present embodiment, a polyimide plate whose thickness is 175 μm and size is 10 mm×15 mm is used as the reinforcement 6.

(Method of Combining Reinforcement 6)

Next, a method of combining the reinforcement 6 by using the reinforcement combining apparatus is described.

First, a disposing step is described. In the step, the flexible wiring substrate 5 is disposed between areas of the stage 1 and the tool 3 with its position adjusted.

Here, the position adjustment is performed by image recognition. The position adjustment based on the image recognition covers sequential steps of combining the reinforcement in manufacturing a TPC or a COF in a reel-to-reel manner, thereby bringing about an advantage in mass-production.

Note that, since the flexible wiring substrate 5 is transported by a rail (not shown), the position adjustment in a width direction of the flexible wiring substrate 5, i.e., the position adjustment in a vertical direction with respect to a transport direction of the flexible wiring substrate 5 may be performed. Further, the position adjustment in a longitudinal direction of the flexible wiring substrate 5, i.e., the position adjustment in a transport direction of the flexible wiring substrate 5 may be performed by means of the transport sprocket (not shown) for transporting the flexible wiring substrate 5.

Here, the flexible wiring substrate 5 is disposed between the stage 1 and the tool 3 so that its surface having the conductive wiring faces the tool 3, i.e., upward, so as to be positioned in parallel to the pressing surface 2 of the stage 1 and an upper surface of the heat conduction rubber 8A.

Thereafter, the reinforcement 6 is disposed on the heat conduction rubber 8A fixed on the stage 1 so that its surface having the adhesive 7 faces upward so as to be positioned in parallel to the pressing surface 2 of the stage 1. The reinforcement 6 is transported to the upper surface of the heat conduction rubber 8A positioned on the stage 1 by means of a robot-arm or the like for example. Further, the compressor connected to the second vacuum hole 10 is operated, so that the reinforcement 6 is absorbed and fixed to the heat conduction rubber 8A by the vacuum absorption.

Here, the adhesive 7 applied to the reinforcement 6 is described. The adhesive 7 is used to bond the reinforcement 6 to the flexible wiring substrate 5. In order to avoid troubles such as the adhesive's re-adherence to unnecessary portion after bonding, thermosetting adhesive is used as the adhesive 7. Examples of the thermosetting adhesive include epoxy resin, acrylic resin, and the like. Specifically, as the adhesive 7, D3410 (commercial name) made by Sony Chemicals Corporation is used.

Next, a pressing step is described. After disposing the flexible wiring substrate 5 and the reinforcement 6 at a predetermined position in the foregoing disposing step, the stage 1 is raised and the tool 3 is made to descend, and the flexible wiring substrate 5 and the reinforcement 6 are sandwiched upward and downward, thereby pressing the flexible wiring substrate 5 and the reinforcement 6. Thus, the reinforcement 6 and the flexible wiring substrate 5 are pressed so as to be combined with each other.

In giving the pressure, the surface temperature of the tool 3 and the surface temperature of the stage 1 are set to approximately 200° C., and pressure of approximately 28 Kg/cm$^2$ is given for approximately 3 seconds. The surface temperature of the tool 3 and the surface temperature of the stage 1 are adjusted by the aforementioned heater. When the pressure is given under such a condition, it is possible to bond the flexible wiring substrate 5 and the reinforcement 6 in a preferable manner.

After completing the pressing process, the stage 1 is made to descend and the tool 3 is raised, thereby releasing the flexible wiring substrate 5 and the reinforcement 6 from the pressure exerted thereto. Further, the second vacuum hole 10 is released from the vacuum condition, thereby releasing the reinforcement 6 and the heat conduction rubber 8A from the connection condition. At this time, the reinforcement 6 is surely bonded to the flexible wiring substrate 5.

Thereafter, the flexible wiring substrate 5 is transported so that the flexible wiring substrate 5's area which should be bonded to the reinforcement 6 is disposed at a bonding position of the reinforcement combining apparatus. Further, a next reinforcement 6 is combined in the same manner as described above.

Embodiment 2

Figure 1:
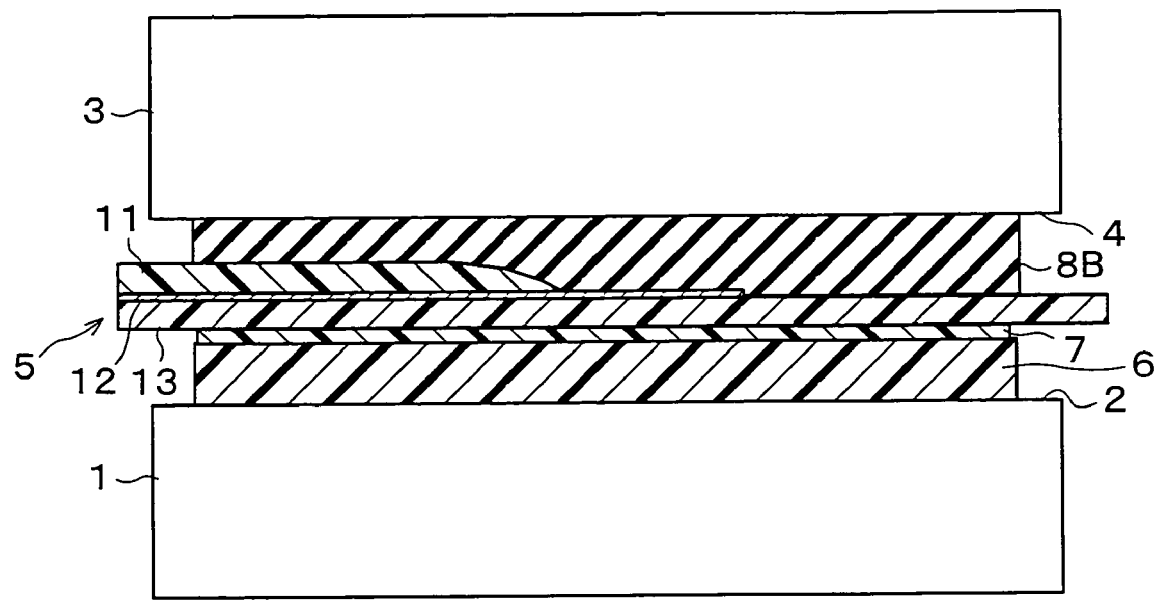
FIG. 1 is a cross sectional view showing an interface between a flexible wiring substrate and a reinforcement in an example of a reinforcement combining apparatus according to the present invention.
Figure 3:
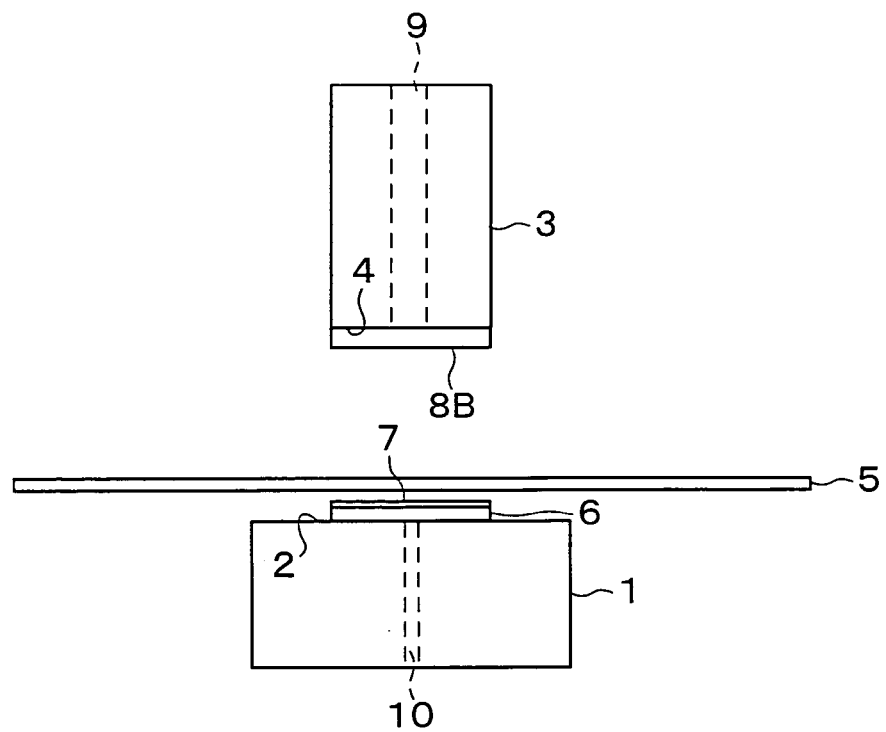
FIG. 3 is a cross sectional view schematically showing a condition under which the reinforcement combining apparatus of FIG. 1 has not combined the reinforcement with the flexible wiring substrate.
Figure 4:
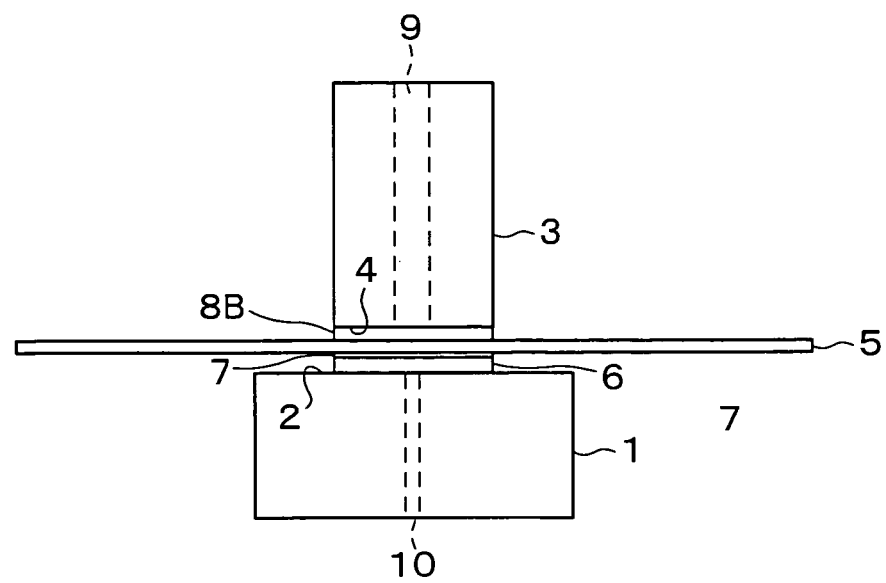
FIG. 4 is a cross sectional view schematically showing a condition under which the reinforcement combining apparatus of FIG. 1 combines the reinforcement with the flexible wiring substrate.

The following description explain another embodiment of the reinforcement combining apparatus of the present invention with reference to FIG. 1, FIG. 3, and FIG. 4. Note that, for the sake of convenience in description, the same reference signs are given to members having the same functions as members described in Embodiment 1, and description thereof is omitted.

The reinforcement combining apparatus of the present embodiment is different from the reinforcement combining apparatus of Embodiment 1 in that: a heat conduction rubber 8B (second buffer member) is disposed on the pressing surface 4 of the tool 3, and no heat conduction rubber is disposed on the stage 1.

FIG. 3 is a cross sectional view schematically showing the reinforcement combining apparatus of the present embodiment, and shows a condition under which the reinforcement has not been combined with the flexible wiring substrate. As shown in FIG. 3, in the reinforcement combining apparatus of the present embodiment, the heat conduction rubber 8B is disposed on the tool 3 as a buffer member so as to provide a buffer property on the pressing surface 4 of the tool 3. The heat conduction rubber 8B is subjected to vacuum absorption by means of the first vacuum hole 9. Further, the reinforcement 6 is directly disposed on the pressing surface 2 of the stage 1. Under such a condition, the reinforcement 6 is subjected to the vacuum absorption by the second vacuum hole 10 provided in the stage 1. Note that, the flexible wiring substrate 5 and the reinforcement 6 are arranged in the same manner as in the arrangement described in Embodiment 1, so that description thereof is omitted.

Under such a condition, the stage 1 and the tool 3 are moved by the step as in Embodiment 1, the flexible wiring substrate 5 and the reinforcement 6 are pressed and combined with each other.

FIG. 4 shows a condition under which the reinforcement is combined with the flexible wiring substrate by using the reinforcement combining apparatus of the present embodiment. FIG. 1 shows an enlarged view of a peripheral portion of an interface between the flexible wiring substrate 5 and the reinforcement 6 that are pressed by the stage 1 and the tool 3 of FIG. 4. As shown in FIG. 1, in the flexible wiring substrate 5, a solder resist 11 is formed as a protection film on a conduction wiring 12 on the tape base material 13 so as to be positioned on an area other than an area having connection terminals (not shown). In this manner, the flexible wiring substrate 5 is arranged so that: (i) an area having the solder resist 11, (ii) an area having the conduction wiring 12, (iii) an area having both the solder resist 11 and the conduction wiring 12, and (iv) an area having neither the solder resist 11 nor the conduction wiring 12 are formed in a mixed manner on an upper surface of the tape base material 13, i.e., on a surface positioned on a backside of a surface connected to the reinforcement 6. In other words, a level difference exists in the flexible wiring substrate 5's surface having the conduction wiring 12 and the solder resist 11. Thus, a thickness of the flexible wiring substrate 5 varies depending on its areas.

On the other hand, in the present reinforcement combining apparatus, the heat conduction rubber 8B provided in the pressing surface 4 of the tool 3 covers the level difference on the flexible wiring substrate 5. That is, the heat conduction rubber 8B is more sufficiently compressed at a position where the flexible wiring substrate 5 is thicker. Meanwhile, the heat conduction rubber 8B is less compressed at a position where the flexible wiring substrate 5 is thinner. Thus, also in the case where the flexible wiring substrate 5 is pressed by the stage 1 and the tool 3, pressure is exerted not only to a thicker portion but also to a thinner portion of the flexible wiring substrate 5.

Thus, it is possible to substantially uniformly give the pressure to an entire surface of the connection portion between the flexible wiring substrate 5 and the reinforcement 6. Therefore, it is possible to surely extrude the air bubble brought about (i) in the interface between the adhesive 7 and the reinforcement 6 or the flexible wiring substrate or (ii) in the adhesive 7 throughout the foregoing connection portion.

Here, in order to uniformly give the pressure to the whole connection portion between the flexible wiring substrate 5 and the reinforcement 6, it is necessary to set a thickness of the heat conduction rubber 8B disposed on the tool 3 to be a predetermined value or more. Specifically, it is preferable to set the thickness of the heat conduction rubber 8B to be not less than a sum of (i) a thickness of the conduction wiring 12, (ii) a thickness of the solder resist 11, and (iii) an error range of flatness required in the flexible wiring substrate 5.

Moreover, it is preferable to set the thickness of the heat conduction rubber 8B so that a stress exerted in compressing the heat conduction rubber 8B so as to have the foregoing sum is within a predetermined value, in consideration for the elasticity of the heat conduction rubber 8B. In this case, it is possible to set a difference between a pressure exerted to a thickest portion of the flexible wiring substrate 5 and a pressure exerted to a thinnest portion of the flexible wiring substrate 5 to be a predetermined value or less, so that it is possible to more uniformly give the pressure to the whole connection portion between the flexible wiring substrate 5 and the reinforcement 6.

As described above, it is preferable to set the thickness of the heat conduction rubber 8B disposed on the tool 3 so that a buffer property of the heat conduction rubber 8B covers the level difference, that is, it is preferable to set the thickness so that the heat conduction rubber 8B causes the whole surface of the flexible wiring substrate 5 and the reinforcement 6 to be uniformly pressed. Specifically, it is preferable to set the thickness of the heat conduction rubber 8B to be not less than 300 µm.

Note that, the present embodiment shows the foregoing standard in designing the thickness of the heat conduction rubber 8B disposed on the tool 3, but it is possible to apply the standard to Embodiment 1 in designing the thickness of the heat conduction rubber 8A disposed on the stage 1.

Embodiment 3

Figure 5:
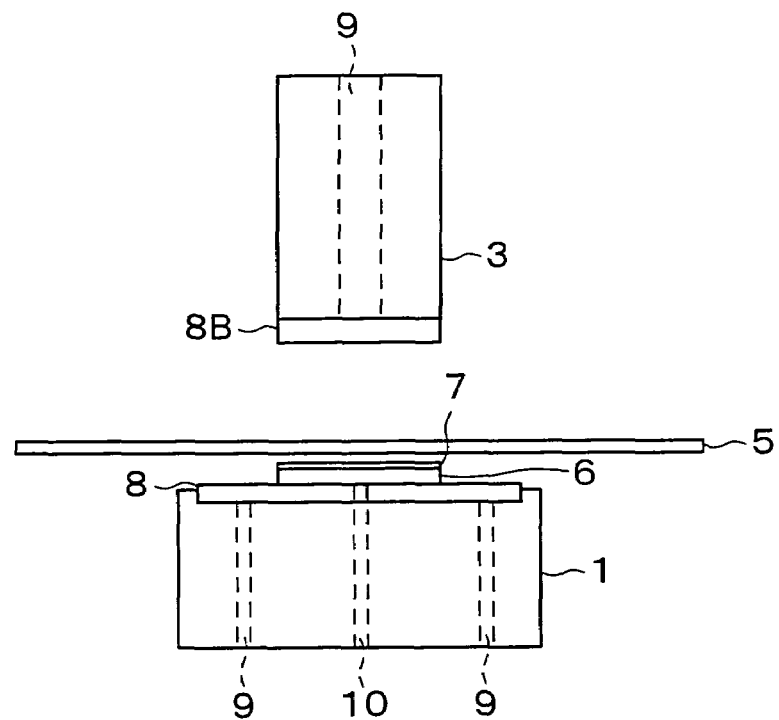
FIG. 5 is a cross sectional view schematically showing an example of a reinforcement combining apparatus according to the present invention which is different from the reinforcement combining apparatus shown in FIG. 1 and FIG. 2.
Figure 6:
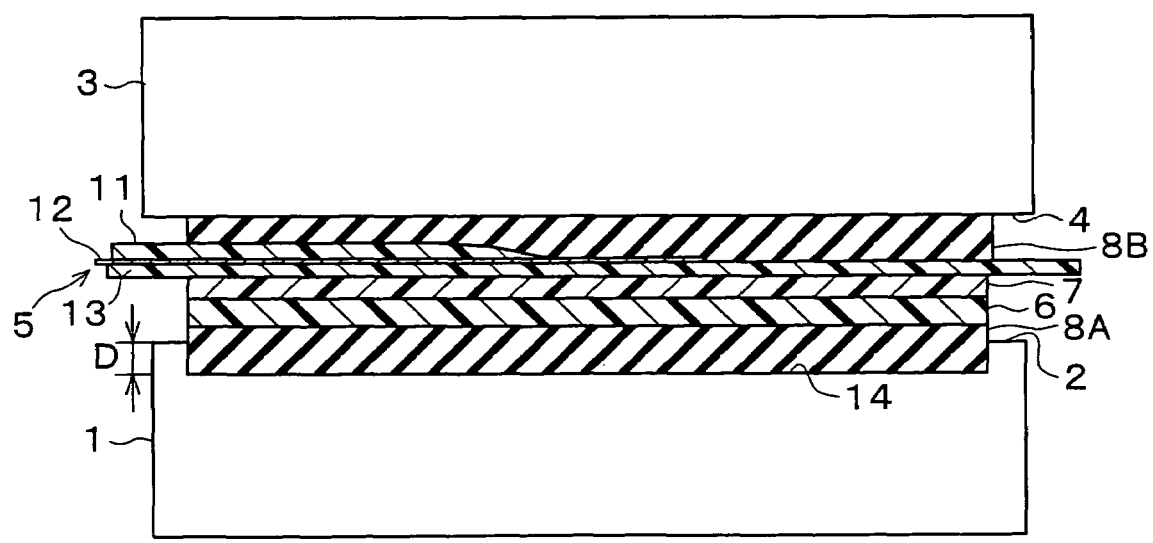
FIG. 6 is a cross sectional view showing an interface between a reinforcement and a flexible wiring substrate in case where the reinforcement combining apparatus shown in FIG. 5 combines the reinforcement with the flexible wiring substrate.
Figure 7:
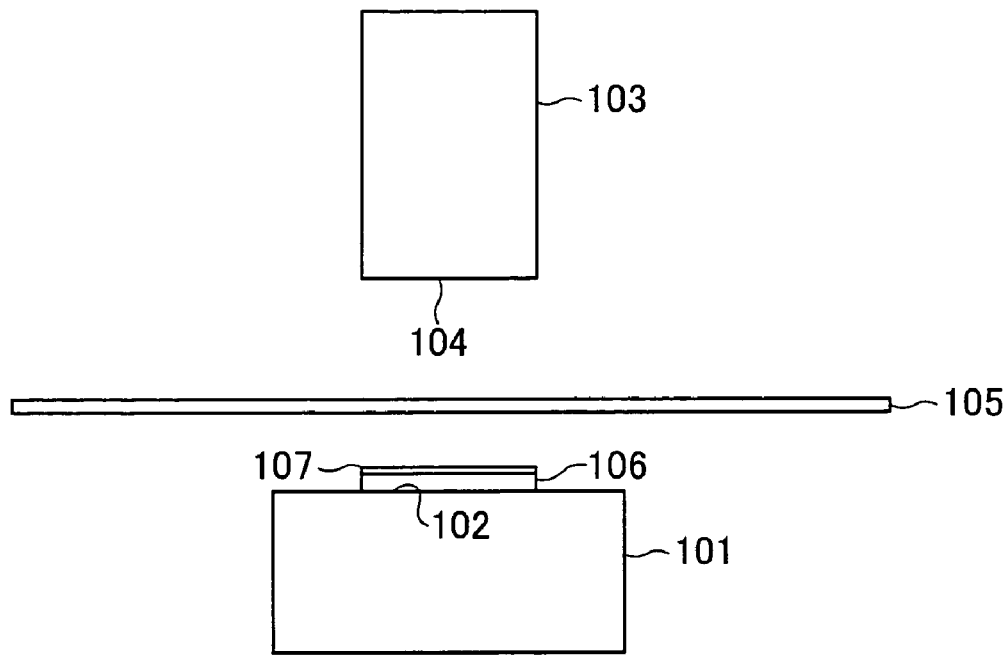
FIG. 7 is a cross sectional view schematically showing an example of a conventional reinforcement combining apparatus.
Figure 8:
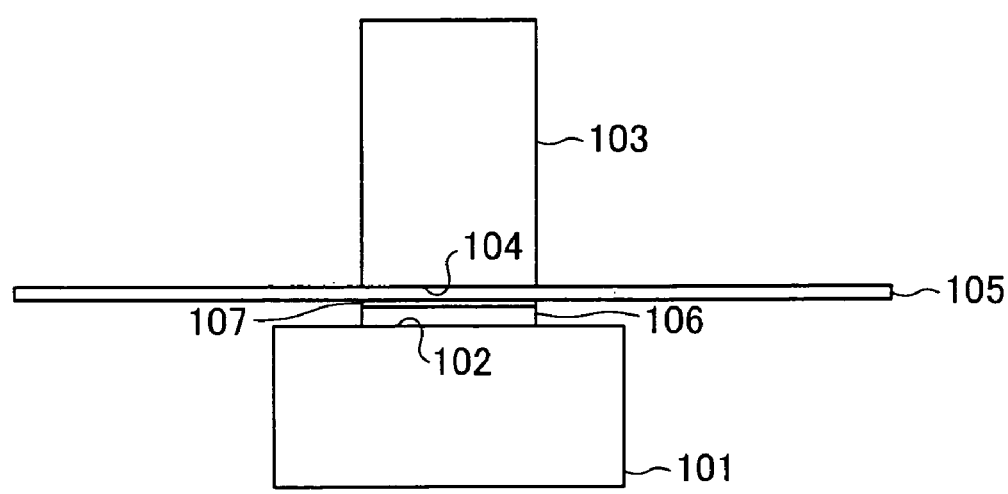
FIG. 8 is a cross sectional view schematically showing a condition under which the reinforcement combining apparatus of FIG. 7 combines a reinforcement with a flexible wiring substrate.
Figure 9:
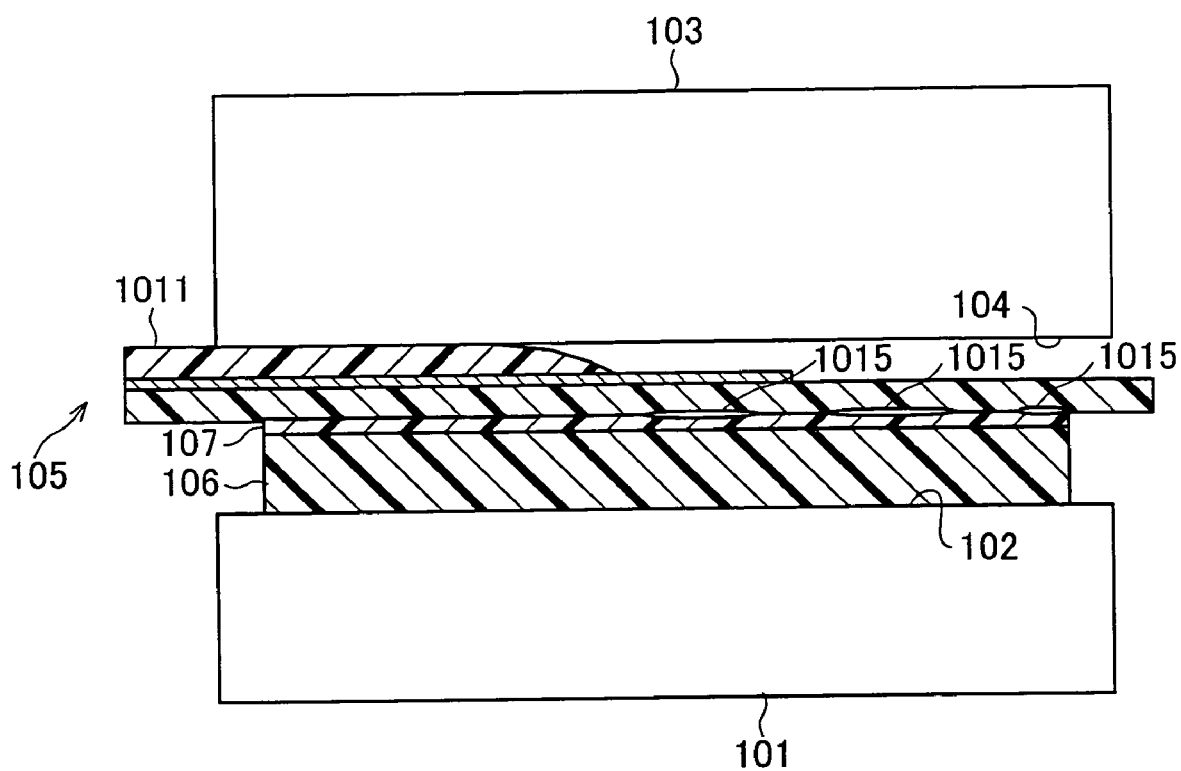
FIG. 9 is a cross sectional view showing an interface between the flexible wiring substrate and the reinforcement in case of combining a reinforcement with a flexible wiring substrate that are shown in FIG. 8.

As to the reinforcement combining apparatus of the present invention, the following description explain an embodiment other than Embodiments 1 and 2 with reference to FIG. 5 and FIG. 6. Note that, for the sake of convenience in description, the same reference signs are given to members having the same functions as members described in Embodiments 1 and 2, and description thereof is omitted.

The reinforcement combining apparatus of the present embodiment is different from the reinforcement combining apparatus of Embodiments 1 and 2 in that: it is not so arranged that the heat conduction rubber is disposed on either the stage 1 or the tool 3, but the heat conduction rubber 8A is disposed on the pressing surface 2 of the stage 1 and the heat conduction rubber 8B is disposed on the pressing surface 4 of the tool 3.

FIG. 5 is a cross sectional view schematically showing the reinforcement combining apparatus of the present embodiment, and shows a condition under which the reinforcement is combined with the flexible wiring substrate. As shown in FIG. 5, in the reinforcement combining apparatus of the present embodiment, the heat conduction rubber 8A is disposed on the stage 1 and the heat conduction rubber 8B is disposed on the tool 3. In accordance with vacuum absorption, the heat conduction rubber 8A is absorbed and fixed to the stage 1 by means of the first vacuum holes 9, and the heat conduction rubber 8B is absorbed and fixed to the tool 3 by means of another first vacuum hole 9. The reinforcement 6 is subjected to the vacuum absorption by means of the second vacuum hole 10 provided in the stage 1. Note that, the flexible wiring substrate 5 and the reinforcement 6 are arranged in the same manner as described in Embodiment 1, so that description thereof is omitted.

Under such a condition, the stage 1 and the tool 3 are moved by the step as in Embodiment 1, the flexible wiring substrate 5 and the reinforcement 6 are pressed and combined with each other.

FIG. 6 shows a condition under which the reinforcement 6 is combined with the flexible wiring substrate 5 by using the reinforcement combining apparatus of FIG. 5, and is an enlarged view of a peripheral portion of the interface between the flexible wiring substrate 5 and the reinforcement 6 that are pressed by the stage 1 and the tool 3. As shown in FIG. 6, the heat conduction rubber 8B is disposed on the pressing surface 4 of the tool 3 and the heat conduction rubber 8A is disposed on the pressing surface 2 of the stage 1, so that it is possible to preferably cover the level difference of the flexible wiring substrate 5 that is caused by the conductive wiring 12 and the solder resist 11. That is, it is possible to uniformly give the pressure exerted by the stage 1 and the tool 3 to an entire surface of the flexible wiring substrate 5 and an entire surface of the reinforcement 6 via the heat conduction rubbers 8A and 8B. Thus, it is possible to stably combine the flexible wiring substrate 5 with the reinforcement 6.

Further, in the present embodiment, a recession 14 (first recession) is formed on the stage 1's surface where the heat conduction rubber 8A is disposed, thereby disposing the heat conduction rubber 8A on the recession 14. In combining the reinforcement, it is possible to prevent the heat conduction rubber 8A from exfoliating from the stage 1 by means of the vacuum absorption. However, when the reinforcements 6 are sequentially combined with the flexible wiring substrates so many times, it is often that a position at which the heat conduction rubber 8A is disposed gradually deviates in a plane direction of the stage 1. Thus, in order to prevent the heat conduction rubber 8A from deviating in a parallel direction, the recession 14 is provided. A periphery of the recession 14 corresponds to an outer frame of the heat conduction rubber 8A. A depth D of the recession 14 is not particularly limited, but specifically, the depth D is set to 200 μm when the heat conduction rubber 8A on the stage 1 is set to 450 μm.

Note that, the recession 14 is provided only on the side of the stage 1 in the present embodiment, but it may be so arranged that the recession 14 is provided on the side of tool 3. Further, in Embodiments 1 and 2, it may be so arranged that the recession is likewise provided on the stage 1 where the heat conduction rubber 8A is disposed or the tool 3 where the heat conduction rubber 8B is disposed.

Further, in the present embodiment, the heat conduction rubber 8A is provided on the stage 1 and the heat conduction rubber 8B is provided on the tool 3. It is possible to apply the standard described in Embodiment 2 to the thickness of each of the heat conduction rubbers 8A and 8B. That is, in the present embodiment, it is preferable to set a sum of (i) a thickness of the heat conduction rubber 8A disposed on the side of the stage 1 and (ii) a thickness of the heat conduction rubber 8B disposed on the side of the tool 3 to be not less than a maximum height from a surface of the tape base material of the flexible wiring substrate 5, said surface having the conductive wiring 12.

As described in Embodiments 1 to 3, the heat conduction rubber 8A having a buffer property is disposed on the pressing surface 2 of the stage 1 and/or the heat conduction rubber 8B having a buffer property is disposed on the pressing surface 4 of the tool 3 in the reinforcement combining apparatus for combining the reinforcement 6 with the flexible wiring substrate 5, so that it is possible to bond the reinforcement 6 with the flexible wiring substrate 5 with them appressed to each other. That is, it is possible to uniformly give the pressure exerted by the stage 1 and the tool 3 to an entire surface of the flexible wiring substrate 5 and an entire surface of the reinforcement 6 via the heat conduction rubbers 8A and 8B. Thus, in case of combining the reinforcement 6 with the flexible wiring substrate by using the adhesive 7, it is possible to stably bond the flexible wiring substrate 5 to the reinforcement 6 with them appressed to each other without bringing about air bubbles in the interface between the flexible wiring substrate 5 and the reinforcement 6.

In addition to the foregoing arrangement, the reinforcement combining apparatus, according to the present invention, which is described in Embodiment 1 to 3, may be arranged so that: the first pressing member is in contact with the reinforcement, and a first buffer member having elasticity which allows the first buffer member to transform at an arbitrary area is provided as a part of the pressing surface of the first pressing member.

According to the foregoing arrangement, the buffer member is provided as a part of the first pressing member's pressing surface contacting the reinforcement, so that it is possible to press an area, which hardly receives pressure due to a level difference brought about in the flexible wiring substrate's surface having a conductive wiring, against the first pressing member from the side of the reinforcement. Thus, the pressure is appropriately exerted to the reinforcement's entire surface contacting the flexible wiring substrate, so that it is possible to make the entire surfaces of the flexible wiring substrate and the reinforcement appressed to each other. The reinforcement and the flexible wiring substrate can be appressed to each other in this manner. Thus, in using adhesive so as to bond the reinforcement to the flexible wiring substrate, it is possible to surely combine the reinforcement with the flexible wiring substrate without bringing about air bubbles in an interface between the reinforcement and the flexible wiring substrate.

Further, in addition to an arrangement of a conventional reinforcement combining apparatus, merely the buffer member is provided on the surface contacting the reinforcement, so that it is not necessary to newly manufacture another reinforcement combining apparatus. That is, it is possible to suppress increase in the device cost required in adopting the foregoing arrangement.

In addition to the foregoing arrangement, the reinforcement combining apparatus according to the present invention may be arranged so that: the second pressing member is in contact with the flexible wiring substrate, and a second buffer member having elasticity which allows the second buffer member to transform at an arbitrary area is provided as a part of the pressing surface of the second pressing member.

According to the foregoing arrangement, the buffer member is provided as a part of the second pressing member contacting the flexible wiring substrate. Thus, when the flexible wiring substrate and the reinforcement are pressed, the buffer member can cover the level difference brought about in the flexible wiring substrate's surface having the conductive wiring. That is, it is possible to give the pressure to entire connection surfaces of the flexible wiring substrate and the reinforcement via the buffer member, so that it is possible to make the entire surfaces of the flexible wiring substrate and the reinforcement appressed to each other. The reinforcement and the flexible wiring substrate can be appressed to each other in this manner. Thus, in using adhesive so as to bond the reinforcement to the flexible wiring substrate, it is possible to surely combine the reinforcement with the flexible wiring substrate without bringing about air bubbles in an interface between the reinforcement and the flexible wiring substrate. Therefore, it is possible to perform the bonding process with high durability and quality.

Further, in addition to an arrangement of a conventional reinforcement combining apparatus, merely the buffer member is provided on the surface contacting the flexible wiring substrate, so that it is not necessary to newly manufacture another reinforcement combining apparatus. That is, it is possible to suppress increase in the device cost required in adopting the foregoing arrangement.

In addition to the foregoing arrangement, the reinforcement combining apparatus according to the present invention may be arranged so that: the first pressing member is in contact with the reinforcement, and a first buffer member having elasticity which allows the first buffer member to transform at an arbitrary area is provided as a part of the pressing surface of the first pressing member.

According to the foregoing arrangement, the buffer member is provided not only on the second pressing member's pressing surface contacting the flexible wiring substrate but also on the first pressing member's pressing surface contacting the reinforcement. That is, the pressure is exerted to both the flexible wiring substrate and the reinforcement via the buffer members, so that it is possible to more uniformly press the entire connection surfaces of the flexible wiring substrate and the reinforcement. Thus, it is possible to surely make the flexible wiring substrate and the reinforcement appressed to each other.

Further, in addition to an arrangement of a conventional reinforcement combining apparatus, merely the buffer members are provided on the surface contacting the reinforcement and on the surface contacting flexible wiring substrate, so that it is not necessary to newly manufacture another reinforcement combining apparatus. That is, it is possible to suppress increase in the device cost required in adopting the foregoing arrangement.

In addition to the foregoing arrangement, the reinforcement combining apparatus according to the present invention may be arranged so that: the first pressing member is in contact with the reinforcement, and reinforcement fixing means for fixing the reinforcement is provided on the first pressing member.

According to the foregoing arrangement, the reinforcement is fixed on the first pressing member by means of the reinforcement fixing means in pressing the flexible wiring substrate and the reinforcement, so that it is possible to prevent a position of the reinforcement from deviating in pressing the flexible wiring substrate and the reinforcement. Thus, it is possible to bond the reinforcement to the flexible wiring substrate so that a positional relationship between the flexible wiring substrate and the reinforcement is appropriately kept.

In addition to the foregoing arrangement, the reinforcement combining apparatus according to the present invention may be arranged so that: the reinforcement fixing means fixes the reinforcement in accordance with vacuum absorption.

According to the foregoing arrangement, the reinforcement is fixed in accordance with the vacuum absorption, so that it is possible to fix the reinforcement to the first pressing member without performing a special process with respect to the reinforcement. Further, after combining the reinforcement with the flexible wiring substrate, the reinforcement is released from the vacuum condition, so that it is possible to easily remove the reinforcement from the first pressing member in a short time. That is, it is possible to easily fix and remove the reinforcement to and from the first pressing member, so that it is possible to enhance accuracy in positioning the reinforcement and reduce the manufacturing time.

In addition to the foregoing arrangement, the reinforcement combining apparatus according to the present invention may be arranged so that: the first buffer member is fixed to the first pressing member in accordance with vacuum absorption and/or the second buffer member is fixed to the second pressing member in accordance with the vacuum absorption.

According to the foregoing arrangement, one or more buffer members are fixed to the first pressing member and/or the second pressing member in accordance with the vacuum absorption, so that the buffer member does not deviate from a predetermined position in pressing the flexible wiring substrate and the reinforcement. Further, by releasing the buffer member from the vacuum condition, it is possible to easily remove the buffer member. Thus, even when the buffer member is worn out after being used for an extended period of time, it is possible to easily remove the worn-out buffer member and easily replace the buffer member with new one.

In addition to the foregoing arrangement, the reinforcement combining apparatus according to the present invention may be arranged so as to include heating means for heating the pressing surface of the first pressing member and/or the pressing surface of the second pressing member.

According to the foregoing arrangement, it is possible to cause the heating means to adjust temperature of the pressing surface of the first pressing member and/or the pressing surface of the second pressing member. Thus, when thermosetting adhesive is used to bond the reinforcement to the flexible wiring substrate, it is possible to surely control a condition under which the thermosetting adhesive is heated. Thus, it is possible to make a bonding condition of the flexible wiring substrate and the reinforcement preferable and stable.

In addition to the foregoing arrangement, the reinforcement combining apparatus according to the present invention may be arranged so that: the first and second buffer members are made of heat conduction rubber.

According to the foregoing arrangement, the buffer member is made of heat conduction rubber. Thus, when the thermosetting adhesive is used to bond the reinforcement to the flexible wiring substrate and the thermosetting adhesive is heated by the heating means, it is possible to transmit heat to the thermosetting adhesive via the heat conduction rubbers. Therefore, it is possible to surely cause the thermosetting adhesive to set.

In addition to the foregoing arrangement, the reinforcement combining apparatus according to the present invention may be arranged so that: a thickness of the second buffer member provided on the pressing surface of the second pressing member is not less than a maximum height from a surface of the film substrate of the flexible wiring substrate, said surface having the conductive wiring.

According to the foregoing arrangement, a thickness of the buffer member provided on the pressing surface of the second pressing member is not less than a maximum height from a surface of the film substrate of the flexible wiring substrate, said surface having the conductive wiring, so that the buffer member can cover a level difference on the flexible wiring substrate without fail. Thus, when the flexible wiring substrate and the reinforcement are pressed by using the reinforcement combining apparatus, the pressure is appropriately exerted to the entire connection surfaces of the flexible wiring substrate and the reinforcement via the buffer member, so that it is possible to surely make the flexible wiring substrate and the reinforcement appressed to each other.

In addition to the foregoing arrangement, the reinforcement combining apparatus according to the present invention may be arranged so that: a first recession is provided on the pressing surface of the first pressing member where the first buffer member is disposed, and at least one part of the first buffer member engages with the first recession, and/or a second recession is provided on the pressing surface of the second pressing member where the second buffer member is disposed, and at least one part of the second buffer member engages with the second recession.

According to the foregoing arrangement, at least one part of the buffer member engages with the recession provided on the pressing surface of the first pressing member and/or the pressing surface of the second pressing member, so that it is possible to prevent the buffer member from deviating in a surface direction of the pressing surface. Thus, it is possible to avoid a condition under which the buffer member is gradually deviated in the surface direction of the pressing surface by repeating the combining process many times.

In addition to the foregoing method, the reinforcement combining apparatus according to the present invention may be arranged so that: the flexible wiring substrate and the reinforcement are bonded to each other by using thermosetting adhesive.

According to the foregoing method, the flexible wiring substrate and the reinforcement are bonded to each other by using thermosetting adhesive, so that it is possible to cause the thermosetting adhesive to set by heating the thermosetting adhesive, thereby surely making the flexible wiring substrate and the reinforcement appressed to each other. Further, even when heated in a manufacturing process of a semiconductor device after combining the reinforcement with the flexible wiring substrate, the adhesive does not come out, so that the adhesive is not transcribed to an unnecessary portion or is not spattered. Thus, it is possible to bond the reinforcement to the flexible wiring substrate with high quality. Further, in case of punching out an external shape of the flexible wiring substrate to which the reinforcement has been bonded, even when the reinforcement is cut, the adhesive does not adheres to a punching die since the adhesive has set. Thus, it is possible to prevent such trouble that the adhesive is deposited on the punching die.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A reinforcement combining apparatus, comprising:
    a first pressing member having a pressing surface; and
    a second pressing member having a pressing surface opposite to the pressing surface of the first pressing member, wherein:
    the first pressing member and the second pressing member including means for sandwiching and pressing (i) a flexible wiring substrate including a conductive wiring formed on a polymer based flexible film substrate and (ii) a reinforcement, so that pressure causes the reinforcement to be combined with the flexible wiring substrate on a side of the flexible wiring substrate opposite a connector-installation area of the flexible wiring substrate,
    at least one of the pressing surfaces of the first pressing member and the second pressing member has elasticity which allows the pressing surface of the first pressing member and/or the pressing surface of the second pressing member to transform at an arbitrary area,
    a first recession provided on the pressing surface of the first pressing member, and a first buffer member detachably provided by fitting part of the first buffer member in the first recession so that the first buffer member can be detached from the recession;
    a first vacuum hole provided in the pressing surface of the first pressing member to engage the first buffer member and hold the first buffer member in the first recession; and
    a second vacuum hole provided in the pressing surface of the first pressing member and extending through the first buffer member to engage and hold the reinforcement against the first buffer member.

2. The reinforcement combining apparatus as set forth in claim 1, wherein:
    the first pressing member is in contact with the reinforcement, and
    the first buffer member has elasticity which allows the first buffer member to transform at an arbitrary area, wherein the first buffer member is provided as a part of the pressing surface of the first pressing member.

3. The reinforcement combining apparatus as set forth in claim 1, wherein:
    the second pressing member is in contact with the flexible wiring substrate, and
    a second buffer member having elasticity which allows the second buffer member to transform at an arbitrary area is provided as a part of the pressing surface of the second pressing member.

4. The reinforcement combining apparatus as set forth in claim 3, wherein:
    the first pressing member is in contact with the reinforcement, and
    the first buffer member has elasticity which allows the first buffer member to transform at an arbitrary area, wherein the first buffer member is provided as a part of the pressing surface of the first pressing member.

5. The reinforcement combining apparatus as set forth in claim 1, wherein:
    the first pressing member is in contact with the reinforcement, and
    reinforcement fixing means for fixing the reinforcement is provided on the first pressing member.

6. The reinforcement combining apparatus as set forth in claim 5, wherein the reinforcement fixing means fixes the reinforcement in accordance with vacuum absorption.

7. The reinforcement combining apparatus as set forth in claim 2, wherein the first buffer member is fixed to the first pressing member in accordance with vacuum absorption.

8. The reinforcement combining apparatus as set forth in claim 3, wherein the second buffer member is fixed to the second pressing member in accordance with vacuum absorption.

9. The reinforcement combining apparatus as set forth in claim 4, wherein the first buffer member is fixed to the first pressing member in accordance with vacuum absorption and/or the second buffer member is fixed to the second pressing member in accordance with the vacuum absorption.

10. The reinforcement combining apparatus as set forth in claim 1, comprising heating means for heating the pressing surface of the first pressing member and/or the pressing surface of the second pressing member.

11. The reinforcement combining apparatus as set forth in claim 2, wherein the first buffer member has heat conductivity.

12. The reinforcement combining apparatus as set forth in claim 3, wherein the second buffer member has heat conductivity.

13. The reinforcement combining apparatus as set forth in claim 4, wherein the first and second buffer members have heat conductivity.

14. The reinforcement combining apparatus as set forth in claim 2, wherein the first buffer member is made of heat conduction rubber.

15. The reinforcement combining apparatus as set forth in claim 3, wherein the second buffer member is made of heat conduction rubber.

16. The reinforcement combining apparatus as set forth in claim 4, wherein the first and second buffer members are made of heat conduction rubber.

17. The reinforcement combining apparatus as set forth in claim 3, wherein a thickness of the second buffer member is not less than a maximum height from a surface of the film substrate of the flexible wiring substrate, said surface having the conductive wiring.

18. The reinforcement combining apparatus as set forth in claim 4, wherein a thickness of the second buffer member is not less than a maximum height from a surface of the film substrate of the flexible wiring substrate, said surface having the conductive wiring.

19. The reinforcement combining apparatus as set forth in claim 2, wherein a first recession is provided on the pressing surface of the first pressing member where the first buffer member is disposed, and at least one part of the first buffer member engages with the first recession.

20. The reinforcement combining apparatus as set forth in claim 3, wherein a second recession is provided on the pressing surface of the second pressing member where the second buffer member is disposed, and at least one part of the second buffer member engages with the second recession.

21. The reinforcement combining apparatus as set forth in claim 4, wherein a first recession is provided on the pressing surface of the first pressing member where the first buffer member is disposed, and at least one part of the first buffer member engages with the first recession, and/or a second recession is provided on the pressing surface of the second pressing member where the second buffer member is disposed, and at least one part of the second buffer member engages with the second recession.

22. A reinforcement combining apparatus combining a reinforcement with a flexible wiring substrate in which a conductive wiring is formed on a film substrate, the reinforcement combining apparatus comprising:

a first pressing member having a pressing surface; and a second pressing member having a pressing surface opposite to the pressing surface of the first pressing member, wherein:

the first pressing member and the second pressing member sandwich and press the flexible wiring substrate and the reinforcement, so that pressure causes the reinforcement to be combined with the flexible wiring substrate;

the second pressing member is in contact with the flexible wiring substrate;

a recession is provided on the pressing surface of the second pressing member; and a buffer member having elasticity which allows the buffer member to transform at an arbitrary area is detachably provided by fitting one part of the buffer member in the recession so that the buffer member can be detached from the recession;

a first vacuum hole provided in the pressing surface of the first pressing member to engage the buffer member and hold the buffer member in the recession; and a second vacuum hole provided in the pressing surface of the first pressing member and extending through the buffer member to engage and hold the reinforcement against the buffer member.

23. The apparatus of claim 22, further comprising another recession provided on the pressing surface of the first pressing member so that another buffer member having elasticity is disposed so that at least part thereof engages the another recession.

* * * * *